United States Patent [19]

Hébert

[11] Patent Number: 5,684,319
[45] Date of Patent: Nov. 4, 1997

[54] SELF-ALIGNED SOURCE AND BODY CONTACT STRUCTURE FOR HIGH PERFORMANCE DMOS TRANSISTORS AND METHOD OF FABRICATING SAME

[75] Inventor: Francois Hébert, Sunnyvale, Calif.

[73] Assignee: National Semiconductor Corporation, Santa Clara, Calif.

[21] Appl. No.: 518,785

[22] Filed: Aug. 24, 1995

[51] Int. Cl.$^6$ ..................... H01L 29/78
[52] U.S. Cl. .............. 257/336; 257/338; 257/340; 437/42; 437/44
[58] Field of Search ................... 257/335, 336, 257/337, 338, 340, 341, 900; 437/42, 44, 48, 50, 141, 149, 152, 160

[56] References Cited

U.S. PATENT DOCUMENTS

| | | | |
|---|---|---|---|
| 4,774,198 | 9/1988 | Contiero et al. | 437/30 |
| 4,853,345 | 8/1989 | Himelick | 437/41 |
| 5,171,706 | 12/1992 | Choy | 437/41 |
| 5,182,222 | 1/1993 | Malhi et al. | 437/41 |
| 5,202,276 | 4/1993 | Malhi | 437/41 |
| 5,316,959 | 5/1994 | Kwan et al. | 437/40 |
| 5,386,133 | 1/1995 | Hiroki | 257/900 |

OTHER PUBLICATIONS

Mutshuhiro Mori, Yasunori Nakano, Tomoyuki Tanaka, "An Insulated Gate Bipolar Transistor with a Self-Aligned DMOS Structure", IEEE CH2528-8/88/0000-0813, 1988, pp. 813-816.

Primary Examiner—Donald Monin
Attorney, Agent, or Firm—Limbach & Limbach L.L.P.

[57] ABSTRACT

A DMOS device structure, and method of manufacturing the same features a self-aligned source and body contact structure which requires no additional masks. Polysilicon spacers are used to form the source region at the periphery of the gate polysilicon. The preferred method of manufacturing uses five masks to produce a discrete DMOS semiconductor chip. An N-- epitaxial layer is grown on an N+ substrate. Thick field oxide is grown. A first mask is used to etch an active region. Thin gate oxide is grown. Doped polysilicon is then deposited. A second mask is used to etch the polysilicon, thereby forming the gates. Insulating oxide is grown. A blanket P body implantation is performed. A thermal drive-in step laterally and vertically diffuses the implanted P type impurity throughout body regions. The insulating oxide is etched. A polysilicon layer is deposited and doped. A dry etch leaves polyslicon spacers along the edges of the gates. A P+ body contact implantation is performed, thereby forming body contact regions. A final annealing step causes vertical and lateral out-diffusion of the N type dopant from the N+ spacers down into substrate to form source N+ regions which partially underlie the gate polysilicon. A third mask is used to etch a gate contact area on a segment of the polysilicon above the field oxide. Metal is deposited, and a fourth photoresist mask delineates a gate pad region and a source pad region which also extends over the source contacts. A passivation layer is deposited and etched in the source and gate pad regions using a fifth mask. In another embodiment, a trench DMOS transistor is fabricated using an additional mask to guide a dry etch to "dig" the trenches.

43 Claims, 9 Drawing Sheets

SELF-ALIGNED SOURCE AND BODY CONTACT STRUCTURE FOR HIGH PERFORMANCE DMOS TRANSISTORS AND METHOD OF FABRICATING SAME

BACKGROUND OF THE INVENTION

1. Field of the Invention

The present invention relates to MOS (metal oxide substrate) transistor devices. Specifically, the present invention relates to DMOS (double diffused MOS) transistors in which a self-aligned contact structure allows the source and body contact to be fabricated without using a mask. The self-aligned contact structure allows a discrete DMOS semiconductor chip to be fabricated using a total of only five masks, and achieves high cell density.

2. Discussion of the Related Art

DMOS (Double Diffused MOS) transistors are a type of MOSFET (Metal On Semiconductor Field Effect Transistor) that uses diffusion to form the transistor regions. The typical application for DMOS transistors is as power transistors. In order to provide high voltage circuits for power integrated circuit applications, DMOS is presently the device of choice. DMOS transistors are widely used in applications which require high power capabilities. DMOS transistors provide higher current per unit area when low forward voltage drops are desired.

In a typical discrete DMOS circuit, several DMOS transistors are fabricated in parallel. Therefore, on a typical discrete DMOS semiconductor, the DMOS devices share a common drain contact (the substrate), their sources are all shorted together with metal, and their gates are shorted together with polysilicon. The discrete DMOS semiconductor thus behaves as if it were one large transistor, even though it is often physically constructed using an array or matrix of smaller transistors all connected in parallel. For a discrete DMOS semiconductor, it is desirable to maximize the conductivity per unit area of DMOS transistor array when it is turned "on" by the gate.

Figure 1:
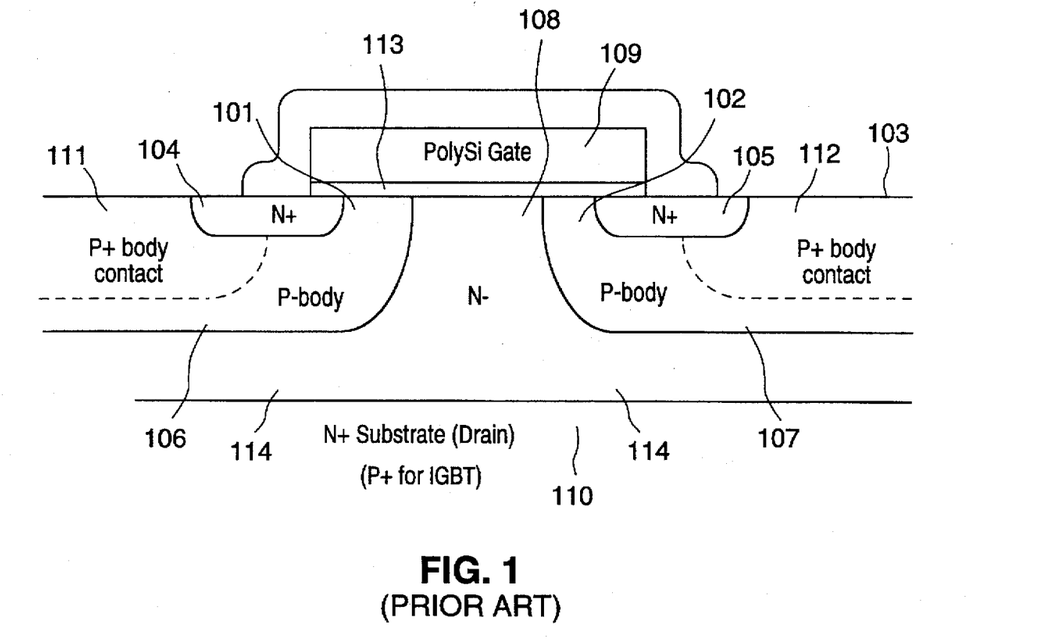
FIG. 1 illustrates a partially completed conventional DMOS transistor pair structure fabricated according to prior art processes.

FIG. 1 depicts a typical DMOS structure. The DMOS transistors have lateral channels 101 & 102 at the surface 103 of the substrate. In an N channel device such as shown in FIG. 1, N+ sources 104 & 105 interface with P− body regions 106 & 107, respectively, in which the respective channels 101 & 102 are formed. Each channel allows current to flow from its source into a shared N− active drain region 108. A shared gate 109 overlies a portion of the sources 104 & 105, bodies 101 & 102, and active drain 108 regions. The gate 109 is formed of polysilicon, silicon, tungsten silicide, or another similar material, and is insulated from the active drain 108, body 101 & 102, and source 104 & 105 regions by gate oxide 113. The structure shown in FIG. 1 is thus two separate transistors which share a gate 109 and an active drain 108, but which have separate body regions 101 & 102 and source regions 104 & 105. An inversion layer at the surface of the P− body regions 101 & 102 underneath the gate 109 forms the channel. The DMOS structure is built upon an N+ substrate 110, which serves as the drain contact.

In order to increase the density the DMOS devices on a chip, it is desirable to minimize the source contact size (not shown) so that adjacent neighboring transistors (not shown) can be fabricated as closely as possible to each DMOS transistor pair. However, this objective is complicated by the fact that an NPN parasitic bipolar transistor is formed by the N+ source (emitter) 104, P− body (base) 106, and N− drain (collector) 108. Similarly, the source 105, body 107, and drain 108 form another NPN parasitic bipolar transistor. In order to prevent the NPN parasitic bipolar transistors from becoming forward biased, it is necessary to short the body regions 106 & 107 to the source regions 104 & 105, respectively, using respective P+ body contacts 111 & 112. The shorting of the sources 104 & 105 to the respective bodies 106 & 107 to prevent forward biasing of the NPN parasitic bipolar transistors does not adversely affect the ability to create an inversion layer in the DMOS devices. However, even if the P+ body contacts 111 & 112 were to have zero resistance, the P− body regions 106 & 107 themselves nonetheless have non-zero resistances. Therefore, it is possible that currents flowing in the P+ bodies 106 & 107 toward the P+ body contacts 111 & 112 will produce voltage drops equal to the diode turn on voltage (of approximately 0.7 Volts), thereby turning on the NPN parasitic bipolar transistors. If the parasitic bipolar transistors become forward biased, the effectiveness of the DMOS devices is destroyed because the gate voltage will no longer be controlling the flow of current from the N+ drain 110 to the sources 104 & 105. Under these circumstances, the formation of an inversion layer under the gate 109 in the P− body regions 106 & 107 will not be necessary for current to flow through the bodies 106 & 107, and furthermore the gate 109 will not be able to inject any current into the bodies 106 & 107 (so as to control the parasitic bipolar transistor) because the gate 109 is electrically isolated by the gate oxide 113, which acts as an insulator. Thus, the DMOS devices will be out of control if the parasitic bipolar transistors become forward biased.

Often the P+ body contacts 111 & 112 are purposefully implanted deeply and with a high doping concentration to insure that the parasitic bipolar transistors do not become forward biased. By making the P+ body contacts 111 & 112 deep, the distance from any point in the P− bodies 106 & 107 to its respective P+ body contact 111 or 112 is decreased, thus decreasing the series resistance through the P− bodies 106 & 107, and correspondingly decreasing any possible voltage drop incurred in the P− bodies 106 & 107. In addition, a higher doping concentration in the parasitic bases 106 & 107 (the P− bodies) decreases the current gain of the parasitic bipolar transistors; thus, very high P+ body contact doping levels are often used.

Figures 2A, 2B:
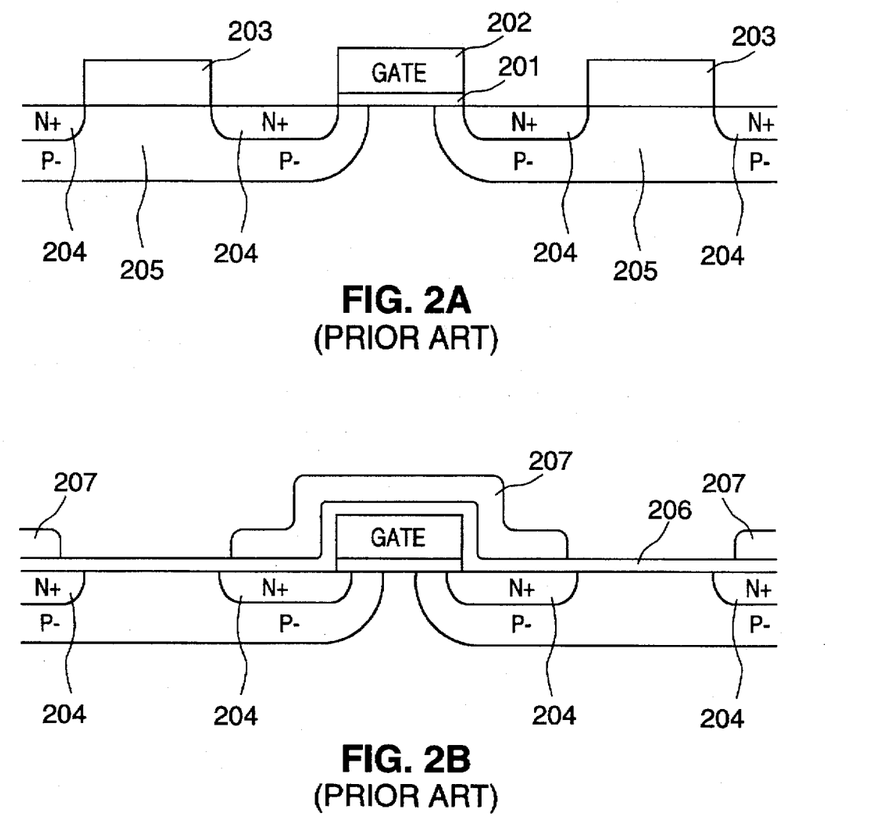
FIG. 2A illustrtes a first photoresist mask used for selective source implantation according to the prior art.
FIG. 2B illustrates a second photoresist mask used for selective etching of oxide to expose a source contact region according to the prior art.
Figure 2C:
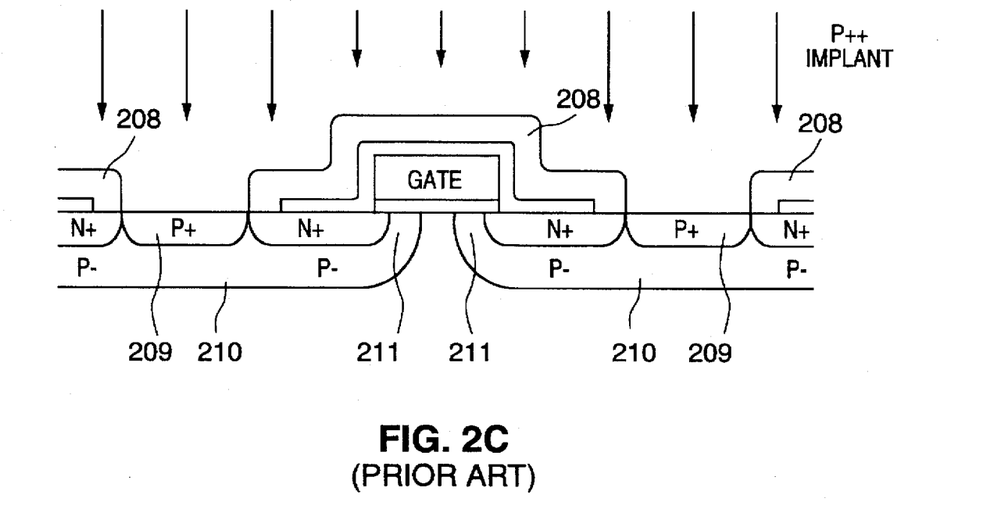
FIG. 2C illustrates a third photoresist mask used to selectively implant a body contact according to the prior art.

FIGS. 2A–2C illustrate a portion of a typical DMOS process. After gate oxide 201 is grown, gate polysilicon 202 is deposited, masked (not shown), and etched back to the substrate to leave the gate polysilicon 202 in the appropriate place, a photoresist mask 203 is deposited to selectively form the source regions 204 by implantation. It is not necessary to cover the gate region 202 with this mask 203 because the gate polysilicon 202 is usually sufficiently thick to protect the region underneath from the implant. If this photoresist mask 203 were not used to direct the source implant, then N+ dopant would (undesirably) be implanted into P+ body contact regions 205 which will be formed later. If N+ dopant were implanted into the body contact regions 205, a very high doping concentration in the subsequent body contact implant would be necessary in order to counteract the high concentration N+ source implantation. Because it is undesirable to counterdope a high dose with a higher dose for manufacturability and controllability reasons, the photoresist mask 203 must be used to preserve the body contact regions 205.

Referring now to FIG. 2B, after the source regions 204 are implanted using the first photoresist mask 203 (shown in FIG. 2A), the first mask 203 is stripped away, and oxide 206 is grown over the entire substrate. Next, another photoresist mask 207 is typically deposited in order to selectively etch the oxide 206 away from the regions in which source contacts (not shown) will be formed. Referring now to FIG. 2C, after the oxide 206 (shown in FIG. 2B) is etched away in the regions not protected by the mask 207 (shown in FIG. 2B) and the mask 207 is stripped away, another photoresist mask 208 is typically deposited in order to selectively implant the P+ body contacts 209. To achieve low resistance through a metal contact to a semiconductor material, it is necessary that the contacted semiconductor material is doped at a relatively high level. Although the P− body regions 210 are already P type material, they were purposefully lightly doped so as to more easily facilitate inversion in the channel regions 211.

Each masking step requires a mask alignment and therefore results in a possible alignment error, undesirably reducing yield. Expected mask alignment errors can be factored into the device dimensions in order to minimize the adverse affect on yield, but this approach increases the cell dimensions, thereby reducing the density of the DMOS transistors on the semiconductor and correspondingly decreasing the conductivity per unit area. Furthermore, masking steps are costly. Since it is generally desirable to reduce the costs of manufacturing DMOS devices, it would be desirable to eliminate some or all of the above-mentioned three masks 203, 207, and 208.

SUMMARY OF THE INVENTION

It is an object of the present invention to provide a DMOS transistor structure which is physically smaller than existing DMOS structures. Another object of the present invention is to provide a method of fabricating DMOS transistors which requires fewer lithographic steps than existing methods.

The present invention is applicable to trench DMOS, polysilicon gate DMOS, integrated DMOS, and IGBT. According to the present invention, polysilicon spacers are used to form the source region at the periphery of the gate polysilicon. This allows a chip to be fabricated using a total of only five masking steps, while the cell formation requires only two masking steps. The closed cell pitch is reduced over the related art. According to the present invention, the devices are fully scaleable. By using spacers, the present invention provides increased metal step coverage without planarization.

The process flow begins with an N+ substrate. An Nepitaxial layer is grown on the N+ substrate. The epitaxial layer formation is followed by growth of a thick field oxide layer. A photoresist mask is deposited onto the field oxide to define the edges of the active region. The field oxide is selectively etched back to the N− epitaxial layer with a wet etch. Then the first photoresist mask is removed. A gate oxidation step is performed to produce a thin gate oxide film on the N− layer. Doped polysilicon is then deposited onto the substrate to form a polysilicon layer. A second photoresist mask is then selectively deposited onto the polysilicon to protect the gate regions from the subsequent etch. Then, a dry etch is performed on the polysilicon regions exposed by the second mask which removes all exposed layers down to the N− layer. The second mask is then removed. A layer of oxide is then grown. A blanket P body implantation is then performed. This implantation is effectively masked by the thick oxide on the polysilicon gates and by the polysilicon gates themselves. A thermal drive-in step then laterally and vertically diffuses the implanted P type impurity throughout the body regions. An etch is then performed without a mask. A polysilicon layer is then deposited across the substrate and doped. A dry etch then removes most of the polysilicon layer, leaving behind polysilicon spacers along the edges of the gates. Then a blanket P+ body contact implantation is performed, thereby forming the body contact regions. A final annealing step is performed to cause vertical and lateral out-diffusion of the N type riopant from the N+ spacers down into substrate to form source N+ regions which partially underlie the gate polysilicon. The P+ body contact implant also diffuses down and sideways to form the body contact regions. Then the third photoresist mask is deposited that delineates a gate contact area on a segment of the polysilicon above the field oxide. An etch is performed to remove the oxide overlying the polysilicon region where the gate contact will be formed. The gate contact mask is then stripped away. Metal is then deposited without a mask. A fourth photoresist mask delineates a metal region for the gate pad and overlies the source contact regions, so as to leave metal source contacts and an area to form a source pad. The metal mask is then stripped away. A passivation layer is then deposited across the chip, and a fifth photoresist mask delineates pad metal bonding regions for the source/body and gate.

According to an alternative embodiment of the present invention, a trench DMOS transistor is fabricated using six masks. After the wet etch of the initial field oxide, the following steps are inserted. A trench photoresist mask is deposited. An anisotropic dry etch is performed to "dig" the trenches. After the trench photoresist is stripped, gate oxide is grown on the sidewalls of the trenches. Then the process reverts to the flow described above.

According to yet another embodiment of the present invention, the structures and methods of the present invention are also fully compatible with Integrated DMOS which use buried layers for drain contacts.

BRIEF DESCRIPTION OF THE DRAWINGS

FIGS. 2A–2C illustrate three conventional masking steps used in prior art processes to fabricate the conventional DMOS structure shown in FIG. 1.

FIGS. 3A–3O are cross-sectional illustrations of the structures resulting from the preferred process steps for fabricating DMOS transistors according to the preferred embodiment of the present invention.

The Figures are more fully explained in the Detailed Description of the Invention.

DETAILED DESCRIPTION OF THE INVENTION

The present invention is applicable to trench DMOS, polysilicon gate DMOS, integrated DMOS (using buried layers for drain contacts), and IGBT (Insulated Gate Bipolar Transistors).

An IGBT is essentially a transistor in which the "parasitic" bipolar transistor, discussed above, inherent in the DMOS structure is made controllable. Referring to FIG. 1, if the substrate 110 were made of P+ material, instead of N+ material as shown, the resulting structure could function as an IGBT. An IGBT is essentially a DMOS transistor with a forward biased diode (formed by the P+ substrate 110 and the N+ region 114) flooding the drift region of the parasitic N+ collector 114. When the IGBT is turned off, the largest voltage drop must be maintained across the collector-base junction. The collector is the N+ region 114 while the base is the P− regions 106 & 107. The doping level in the IGBT collector must be low in order to support the large voltage when the transistor is off. Because the collector doping level is low, in a normal transistor the current in the forward biased mode would be limited by the high resistance of the lowly doped collector. However, in an IGBT, the current is not limited because the forward biased diode floods the collector 114 with holes and electrons. Thus, the current is not limited in the forward mode. IGBTs are normally confined to higher voltage applications than equivalent DMOS structures because of the additional forward-biased diode voltage drop (approximately 0.7 Volts) incurred as current flows into the collector region 114.

According to the present invention, polysilicon spacers are used to form the source region at the periphery of the gate polysilicon. This allows a chip to be fabricated using a total of only five masking steps, while the cell formation requires only two masking steps (steps 1 and 2 below). The five masking steps are: (1) field oxide definition, (2) gate polysilicon definition, (3) gate contact definition, (4) metal mask, and (5) pad mask. Only mask (2) is critical to the cell formation. Masks (1), (3), (4), and (5) are necessary to productize the chip and are necessary for virtually all types of semiconductor chips.

Figure 4:
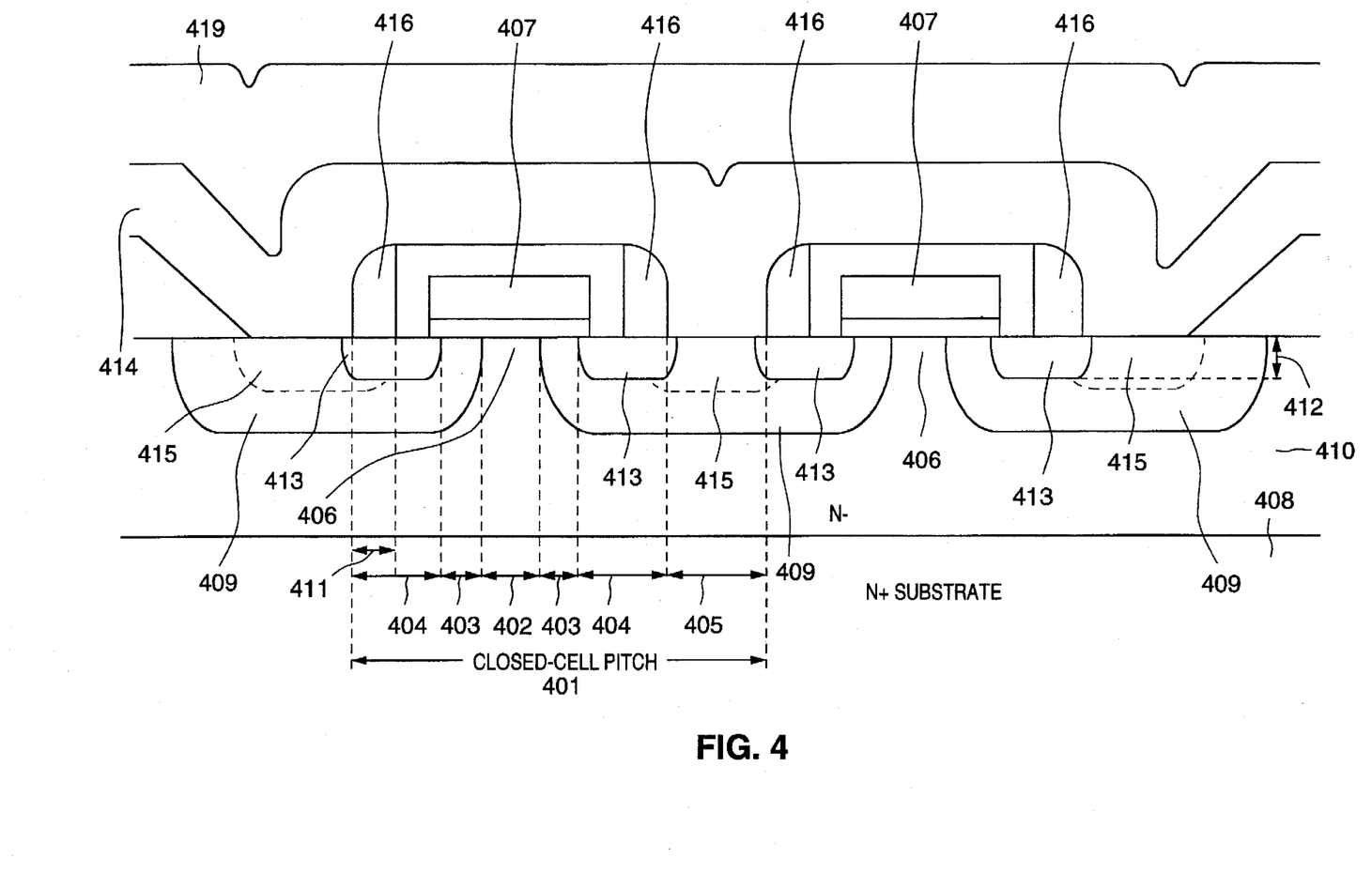
FIG. 4 is a cross-sectional illustration of two final DMOS transistor pair cell structures according to the preferred embodiment of the present invention.

Referring to FIG. 4, the closed cell pitch 401 (total pitch of a pair of DMOS transistors) according to the present invention is reduced over the related art. As shown in FIG. 4, the closed cell pitch is essentially the sum of the following spacings: body-to-body spacing 402, two times the channel length 403, two times the source to polysilicon spacer distance 404, and one body contact width 405. The body contact width 405 is only counted once for each closed cell even though two body contacts must exist for the cell to function properly because each body contact (in a closed cell not at the array periphery) is shared with an adjacent cell. The lower limit of the body-to-body spacing 402 is set by the maximum sizes of the depletion regions (not shown) which are formed in the active drain regions 406 when the DMOS transistors are turned on. If the depletion regions in the active drain regions 406 under the poly gates 407 are allowed to join, higher resistance in the active drain region results for both of the transistors in the DMOS transistor pair because there is less surface area connecting the joined depletion region from the rest of the shared active drain region. This is known as the JFET (Junction Field Effect Transistor) effect.

Of course, it is desirable to minimize all of the above physical dimensions, but some of those dimensions are constrained by the specifications of the device. For example, the channel length 403 is a function of the device structure. Also, the desired output resistance of the device sets physical constraints. The punchthrough effect limits the minimum depth of the N+ substrate 408 since the depletion region (not shown) along the lower surface of the body 409 may reach the N+ substrate drain contact 408 if the N+ substrate 408 is not deep enough, or stated conversely, if the active drain region 410 is not thick enough.

According to the present invention, the source polysilicon contact width 411 and the body contact width 405 can fall anywhere within the range from 0.1 microns to 1 micron, so that the devices are fully scaleable. In contrast to the related art, the allowable depth 412 of the source to body junctions is not dependent on the ability to contact the sources 413. The sources 413 can be made shallow or deep as desired, since the devices according to the present invention place a metal conductor 414 on top of the sources 413 and do not rely on a deep source contact 415.

The lateral dimensions of the device are in part determined by the sideways diffusion of the source and body implants. For example, the P− bodies 409 and N+ sources 413 extend underneath the polysilicon gates 407 through lateral diffusion. During the drive step in which this lateral diffusion occurs, vertical diffusion also occurs and is unavoidable. Because some processes require deep source contacting to behave correctly, those processes cannot necessarily be scaled down beyond a certain lower limit since the decreased lateral diffusion necessary to decrease the channel width (for example) will result in shallower body and source depths and possibly compromise the depth of the source contact. Since the devices according to the present invention do not require deep source contacting, the device is more fully scaleable. Furthermore, because the devices according to the present invention utilize fewer masks than in the related art, the minimum dimensions are not as constrained by mask alignment precision.

In addition, the present invention provides increased metal step coverage without planarization. In discrete DMOS devices, all the sources are contacted through a common metal layer 414. Prior art DMOS transistors include sharper metal edges around the gate. In contrast, according to the present invention, spacers 416 are used to smooth out the gate edges, so that the metal 414 that will later be deposited gets better coverage. This increases the planarization of the metal. Better planarization of a metal layer is more reliable than sharp contours in the metal layer.

Figure 3A:
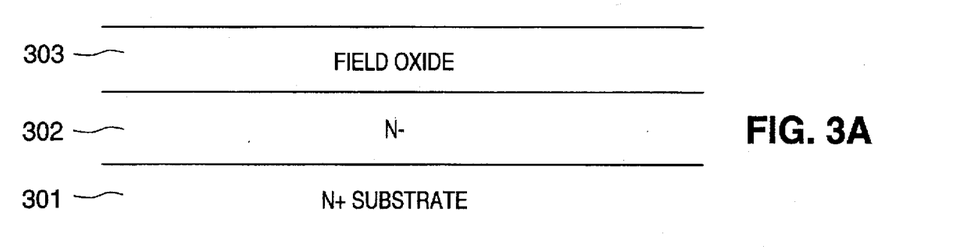
FIG. 3A illustrates the structure after field oxide growth.
Figure 3B:
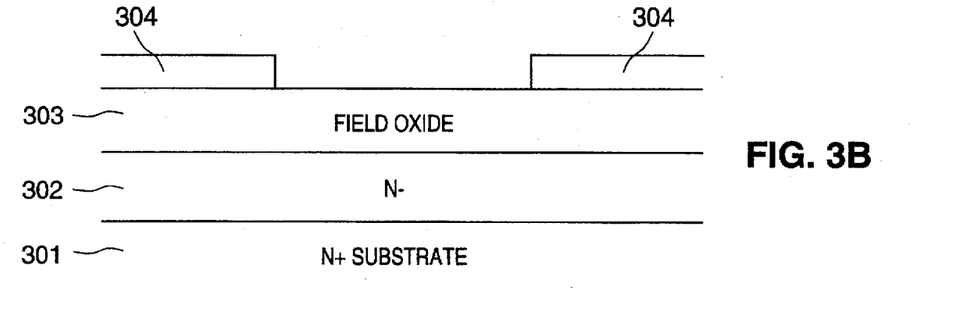
FIG. 3B illustrates the field oxide first photoresist mask.
Figure 3C:
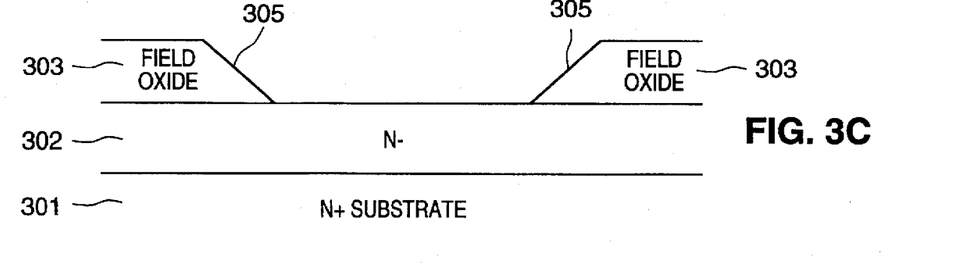
FIG. 3C illustrates the result of the wet etch of the field oxide through the first photoresist mask.
Figure 3D:
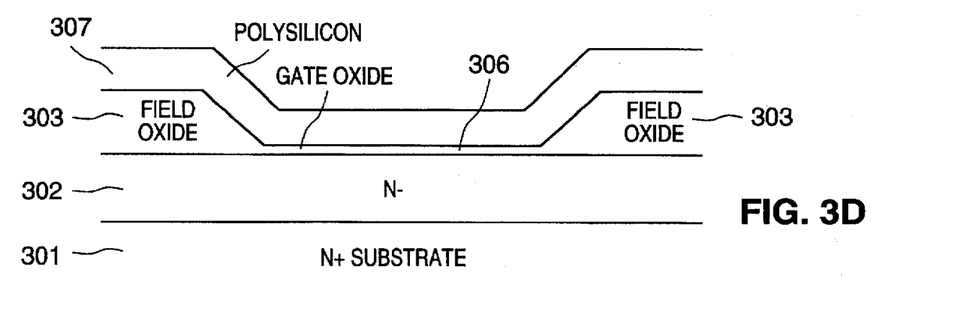
FIG. 3D illustrates the structure after polysilicon gate deposition.
Figure 3E:
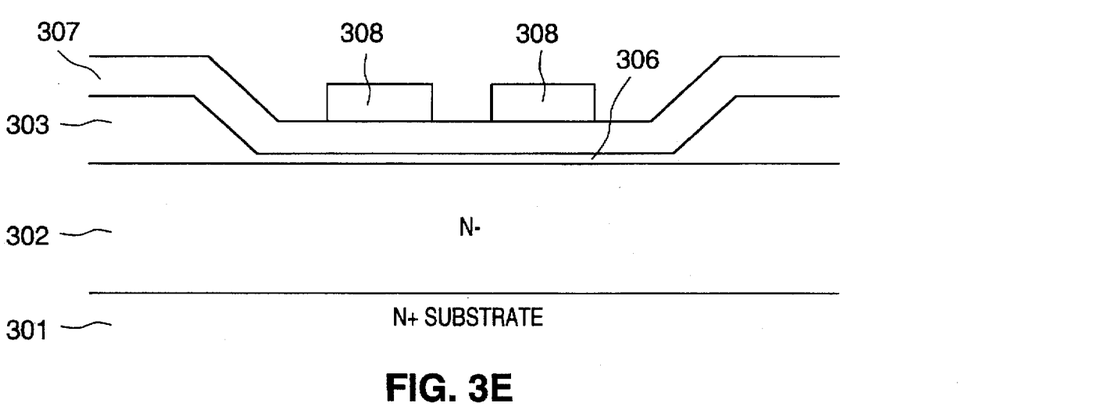
FIG. 3E illustrates the gate polysilicon second photoresist mask.
Figure 3F:
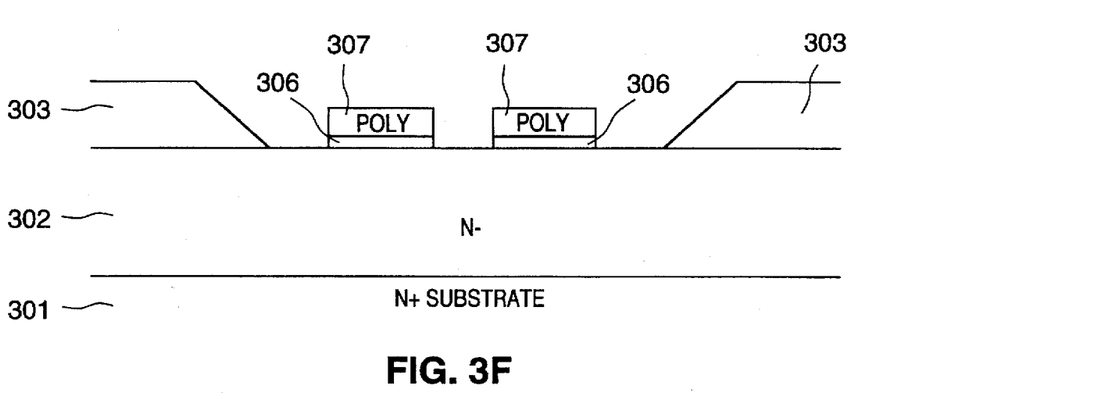
FIG. 3F illustrates the structure after stripping the second mask.
Figure 3G:
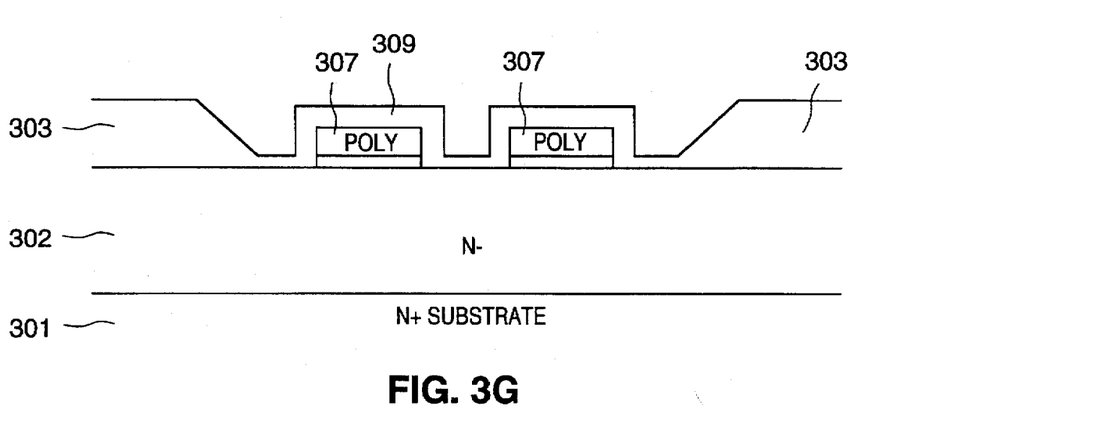
FIG. 3G illustrates the resulting structure after oxide growth.
Figure 3H:
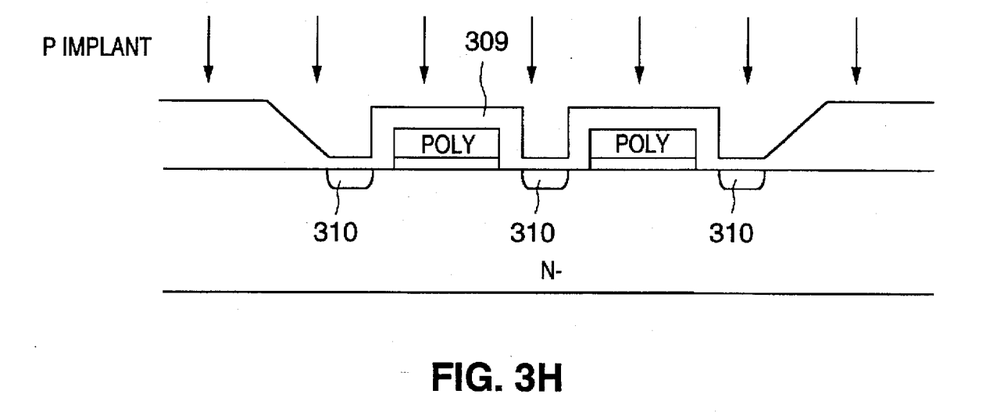
FIG. 3H illustrates the resulting structure after implantation of impurities to form the body regions.
Figure 3I:
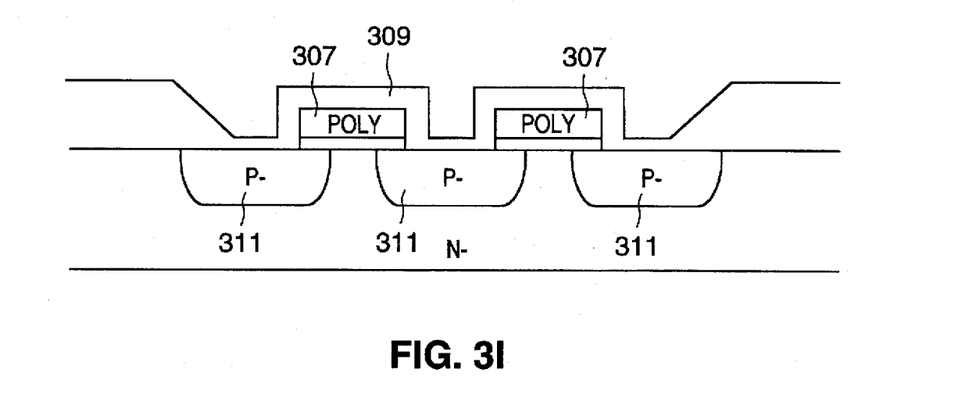
FIG. 3I illustrates the structure after a thermal drive step to diffuse the body regions.
Figure 3J:
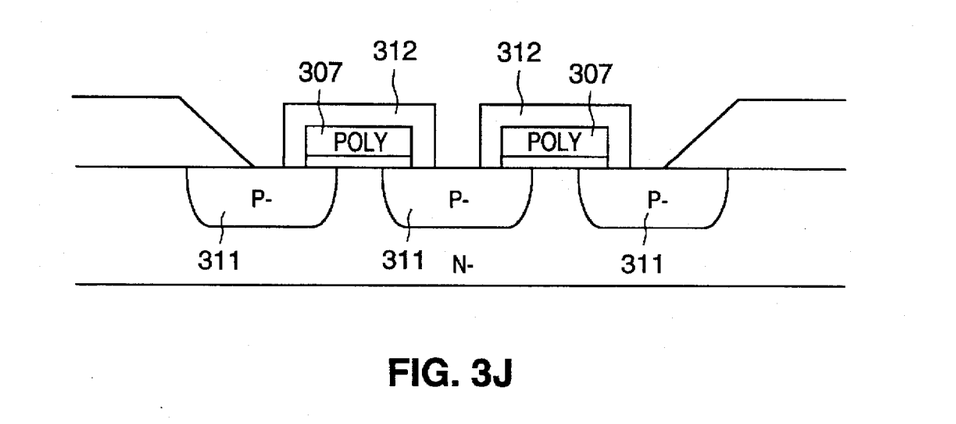
FIG. 3J illustrates the structure after an etch to remove the oxide above the body regions.
Figure 3K:
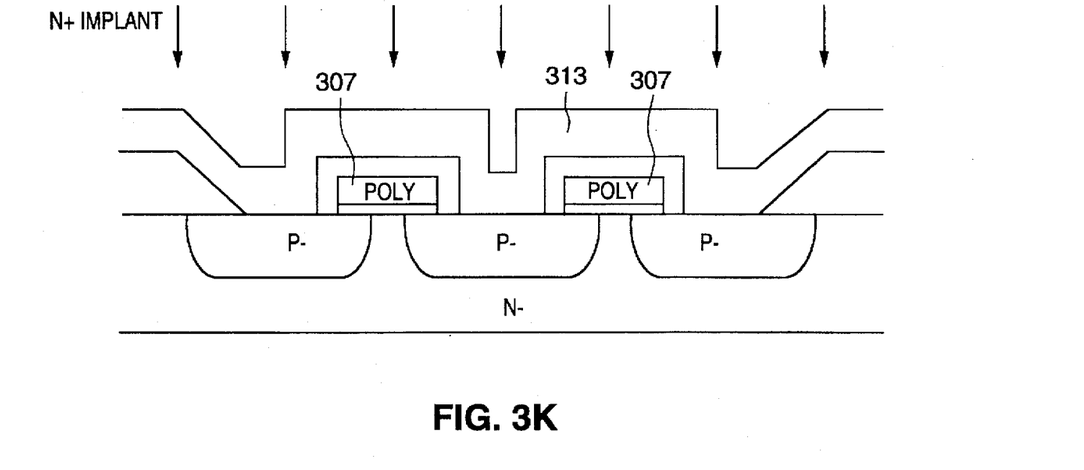
FIG. 3K illustrates the structure after polysilicon deposition and doping.
Figure 3L:
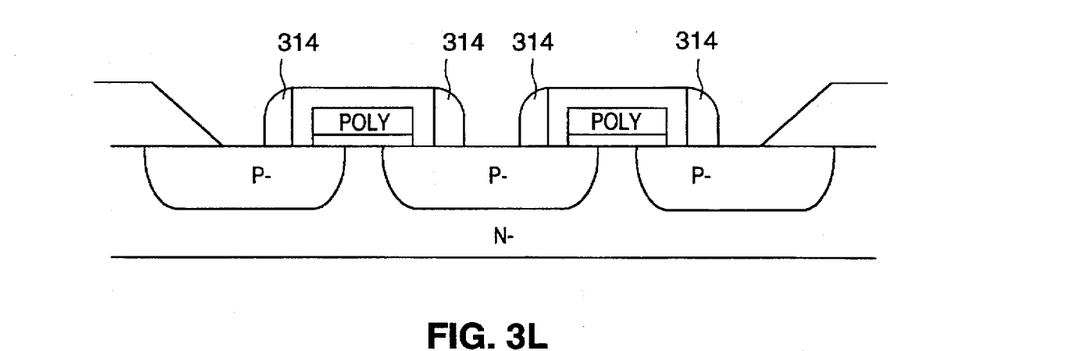
FIG. 3L illustrates the structure after a dry etch of the polysilicon to leave N+ source spacers.
Figure 3M:
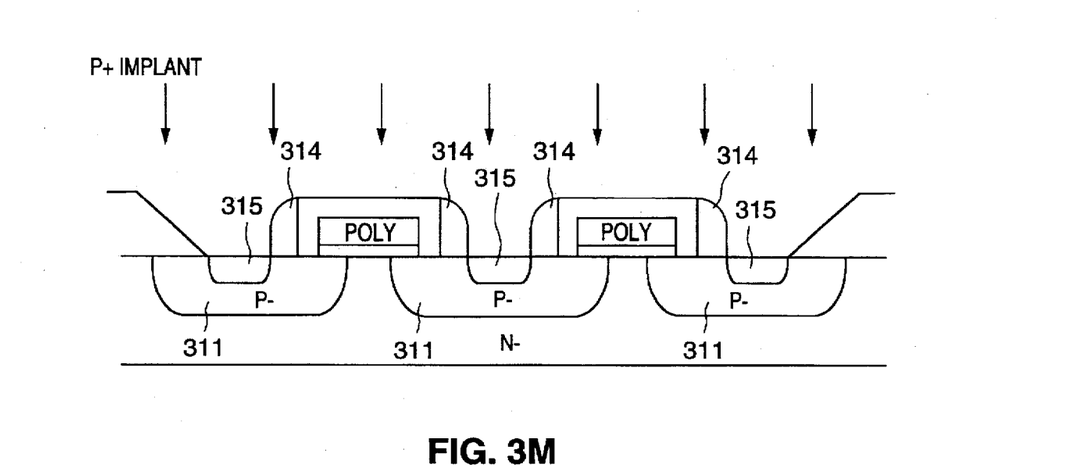
FIG. 3M illustrates the structure resulting from a body contact implantation.
Figure 3N:
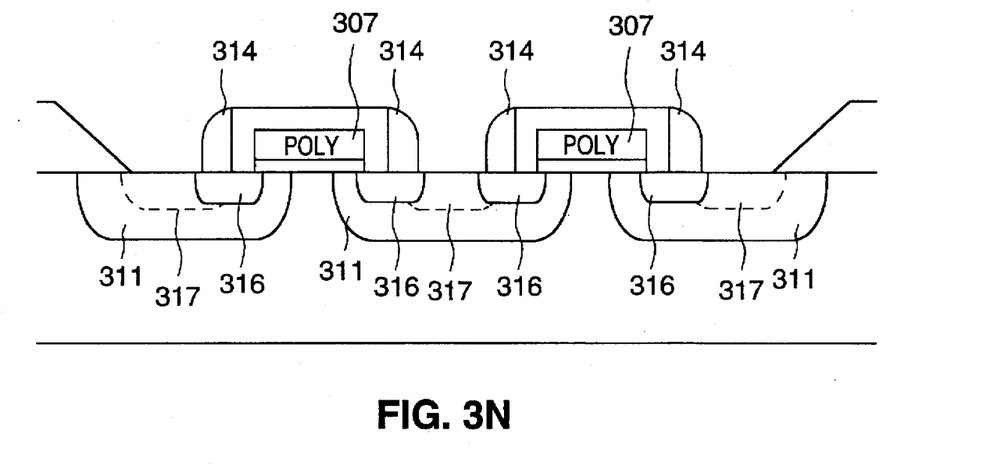
FIG. 3N illustrates the structure resulting from a drive step to diffuse the source regions from the spacers to diffuse the body contact regions.
Figure 3O:
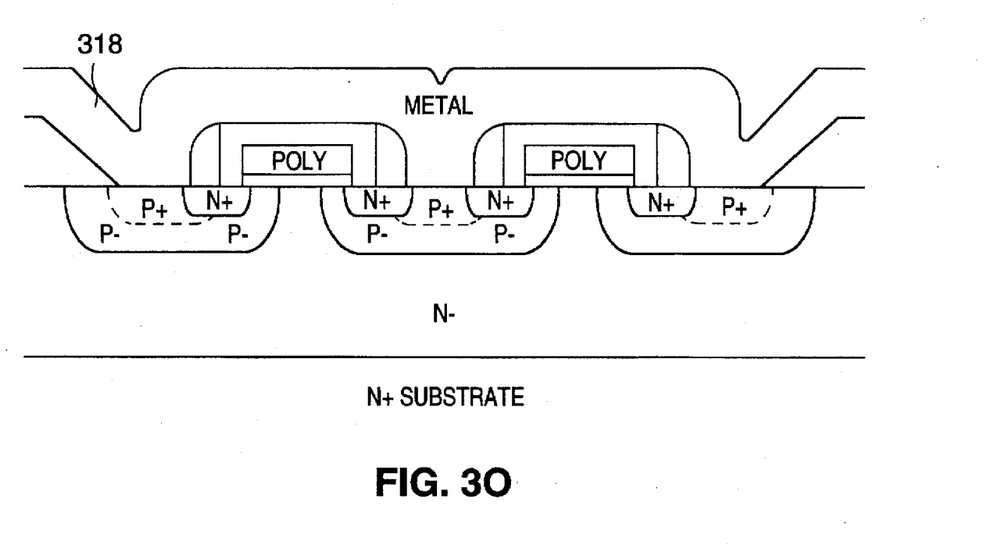
FIG. 3O illustrates the structure resulting from metal deposition.

FIGS. 3A–3O illustrate the method of manufacturing DMOS transistors according to the preferred embodiment of the present invention. Referring to FIG. 3A, the process flow begins with an N+ substrate 301. An N+ epitaxial layer 302 is grown on the N+ substrate 301. The epitaxial layer formation is followed by growth of a thick field oxide layer 303. Field oxide is typically used to minimize the pad capacitances and thus increase performance. The field oxide growth is not necessary in order to practice the present invention, and the elimination of the field oxide eliminates one mask. In the absence of the field oxide 303, the metal input/output pads can be built on a reverse biased diode. In the preferred embodiment, however, field oxide growth is included in the process flow.

Referring now to FIG. 3B, a photoresist mask 304 is deposited onto the field oxide 303 to define the edges of the active region. Using this mask 304, the field oxide 303 is selectively etched back to the N+ epitaxial layer 302 with a wet (isotropic) etch. An isotropic etch is used because it creates a slope 305 (shown in FIG. 3C) on perimeter of the active region rather than a sharp edge which would result from a dry (anisotropic) etch. The reason for using an isotropic etch will be apparent after the below discussion of FIG. 3E. Then the first photoresist mask 304 is removed, leaving the structure shown in FIG. 3C.

Referring now to FIG. 3D, a gate oxidation step is performed to produce a thin gate oxide film 306 on the N+ layer 302. Since this gate oxidation step is performed over the entire surface of the chip without a mask, the thickness of the field oxide 303 is also slightly increased. Doped polysilicon (or polycide such as WSi$_x$/PolySi) is then deposited onto the substrate to form a polysilicon layer 307.

Referring now to FIG. 3E, a second photoresist mask 308 is then formed on the polysilicon 307 to protect the gate regions from the subsequent etch. Then, a dry (anisotropic) etch is performed on the polysilicon regions exposed by the second mask 308 which removes all exposed layers down to the N+ layer 302. The second mask 308 is then removed, leaving the structure shown in FIG. 3F.

Now it is clear why the first etching of the field oxide 303 was a wet etch rather than a dry etch. If a dry etch had been used, a sharp vertical step would be produced at the field oxide 303 perimeter rather than the gentle slope 305 (in FIG. 3C). After the polysilicon deposition 307 (in FIG. 3D), the vertical thickness of the polysilicon 307 along the active region edge would be much greater than the thickness everywhere else. When the dry (vertical) etch is performed, a polysilicon "stringer" (undesired conductive spacer) would be left along the active region perimeter which could short circuit any later deposited metal to the substrate. By using a wet etch for the field oxide 303, the variation of the polysilicon 307 thickness is minimized along the active region perimeter, and the wet etch is adjusted so as to remove the thickest portion along the slope, which is only slightly thicker than the thickness everywhere else on the substrate.

Referring now to FIG. 3G, a layer 309 of oxide is then grown. The doping in the polysilicon 307 causes the oxidation to occur more rapidly on the surfaces of the polysilicon 307 in comparison to the other regions of the substrate; therefore, the resulting oxidation layer 309 is thicker on the top and sides of the polysilicon gates 307 than on the surfaces of the more lightly doped N− layer 302. (See Cuthbertson et al., IEEE J. Solid-State Cir., Feb. 1985, p. 162.)

Referring now to FIG. 3H, a P body implantation is performed without a mask. This implantation is effectively masked by the thick oxide 309 on the polysilicon gates 307 and by the polysilicon gates 307 themselves. The P body 310 will only be implanted through the thinner portions of the oxide layer 309 as shown in FIG. 3H.

Referring now to FIG. 3I, a thermal drive-in step then laterally and vertically diffuses the implanted P type impurity throughout the body regions 311. An etch (preferably wet, but dry is acceptable) is then performed without a mask. Because the oxide 309 overlying the gate polysilicon 307 is thicker than the oxide 309 overlying the body regions 311, after all the oxide 309 is removed from the areas overlying the body regions 311, some oxide 312 (in FIG. 3J) will remain overlying and on the sides of the polysilicon gates 307, as shown in FIG. 3J.

A polysilicon layer 313 is then deposited across the substrate as shown in FIG. 3K. Optionally, a deposition of a thin screen oxide (not shown) is then performed. After the polysilicon 312 is in place and if undoped polysilicon was deposited, it is doped with a high concentration of N type impurities. According to the preferred embodiment, this doping step is performed by ion implantation. However, the doping step may be performed in a number of alternative ways. (1) The N+ type dopant can be implanted. (2) It can be in-situ doped, or in other words, doped simultaneously with being deposited or grown. (3) Alternatively, a dopant diffusion by a pre-deposition process can be used as is known by those skilled in the art. For example, a dopant from POCl$_3$ can be pre-deposited prior to the polysilicon 313 deposition by circulating ambient gas containing POCl$_3$. This causes the dopant (Phosphorous P in this example) to diffuse into the polysilicon 313.

Due to the nature of the polysilicon film 313 coverage, the vertical thickness of the polysilicon 313 along the edges of the gate 307 is much greater than the vertical thickness of this layer 313 everywhere else. An anisotropic (vertical, dry) etch then removes most of the polysilicon layer 313, leaving behind the structure illustrated in FIG. 3L. Because of the large thickness in the polysilicon film 313 at the edge of the gate 307, spacers 314 are left along the sides of the polysilicon gates 307 but separated from the gates 307 by sidewall oxide 312 the dry etch step but separated from the gates 307 by sidewall oxide 312.

As shown FIG. 3M, then a blanket P+ body contact implantation is performed without any mask, thereby forming the body contact regions 315. The dose of the P+ body contact implant is such that is does not compensate the N+ doping in the N+ polysilicon spacers 314. Because the P+ implant does not have to compensate for any previous N type doping within the P− body regions 311, the P+ implant does not need to use an overly high concentration.

Referring now to FIG. 3N, a final annealing step is performed to cause vertical and lateral out-diffusion of the N type dopant from the N+ spacers 314 down into substrate to form source N+ regions 31 6 which partially underlie the gate polysilicon 307. During this annealing step, the P+ body contact implant 315 also diffuses down and sideways to form the body contact regions 317. Because the N+ doping concentration in the spacers 314 is higher than the P− doping concentration in the body regions 311 and is higher than the P+ doping concentration in the body contact regions 315, the diffusion of the N+ dopant into the substrate overcomes the P type dopants in the regions 316 beneath and beside the N+ polysilicon spacers 314 and transforms the area underneath the spacers 314 into N+ source regions 316. As long as the lateral spacing between gates 307 of adjacent cells is sufficiently large so that the lateral diffusion does not cause the drain regions 316 to join, there is remaining P+ body contact material 317 on the surface of the substrate between the spacers 314.

Figure 5:
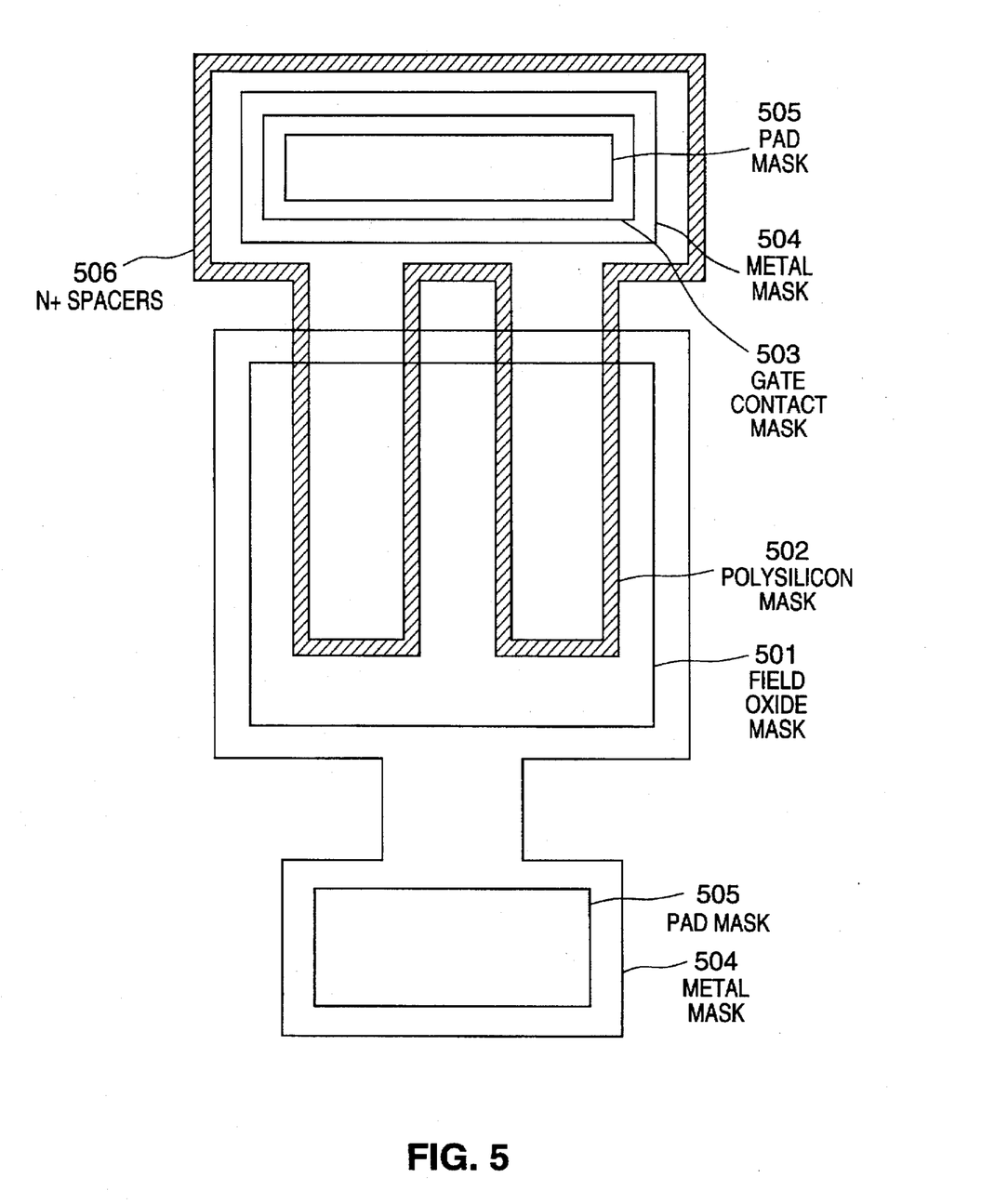
FIG. 5 is a plan view illustration of feasible mask placements for a discrete DMOS semiconductor layout according to the present invention.

The remaining three masking steps are not involved in the formation of the closed cell itself. (Similarly, the first mask which was used to etch back the field oxide in the active area, did not contribute to the DMOS cell itself, but rather was a necessary step in the processing of any semiconductor circuit which will have metal input/output pads.) In order to properly illustrate the remaining masking steps, it is necessary to step back from the cross-sectional view of the DMOS cells and to view a typical circuit according to the present invention in plan view. FIG. 5 illustrates a feasible placement of the five masks used to produce a DMOS transistor semiconductor according to the present invention. The field oxide mask 501 encloses the active DMOS transistor regions. The pads are later fabricated on the field oxide. The polysilicon mask 502 defines the gates of the DMOS transistors within the active region, and extends out of the active region over the field oxide to provide connection to the gate metal pad which will be formed later. The N+ spacers 506 extend around the entire perimeter of the polysilicon, even in the region outside the active area. This paragraph summarizes the plan view of the DMOS semiconductor formation through FIG. 3N of the cross-sectional cell series of Figures.

Then the gate contact third photoresist mask 503 is deposited that delineates a gate contact area on a segment of the polysilicon above the field oxide as shown in FIG. 5. An etch (wet or dry) is performed to remove the oxide overlying the polysilicon region where the gate contact will be formed. The exposed regions of the third gate contact mask 503 must entirely overly polysilicon. In other words, the gate contact mask 503 cannot cross the boundary of the polysilicon. This is a consequence of the fact that the N+ spacer 506 runs around the entire polysilicon region, even above the field oxide outside of the active DMOS area. The N+ spacer 506, even above the field oxide, is electrically connected to the source regions. If gate metal runs over the spacer 506, it will short circuit the gate to the sources. Therefore, the metal gate pad must overly polysilicon. After the oxide has been etched away over back to polysilicon in the exposed regions of the gate contact mask 503, the gate contact mask is then stripped away.

Next, metal 318 (illustrated in FIG. 3O) is deposited without a mask. Then a fourth photoresist mask 504 (in FIG. 5) delineates and protects a closed area entirely above polysilicon which totally overlies, is contained within, or intersects the same area exposed by the third mask 503 so that metal will make electrical contact to the gate polysilicon. The fourth mask 504 also delineates and protects an area above all the source/body contact regions which extends to pad areas which might partially or totally overly field oxide. Input/output pads typically overly field oxide in order to minimize pad-substrate capacitance effects. A selective etch is performed through the metal mask 504. The metal mask 504 is then stripped away.

A passivation layer 419 (illustrated in FIG. 4) is then deposited across the chip, and a fifth photoresist mask 505 (in FIG. 5) delineates pad metal bonding regions for the source/body and gate. In discrete DMOS, because the drain is the substrate itself, the drain is contacted through the back of the chip using a die-attached package. Therefore, no provision is made for the drain in the fifth mask. After the passivation layer 419 is etched away in the exposed pad bonding regions so as to expose the underlying metal, the fifth mask 505 is stripped away. At this point, the processing of the discrete DMOS semiconductor is complete.

Figure 6:
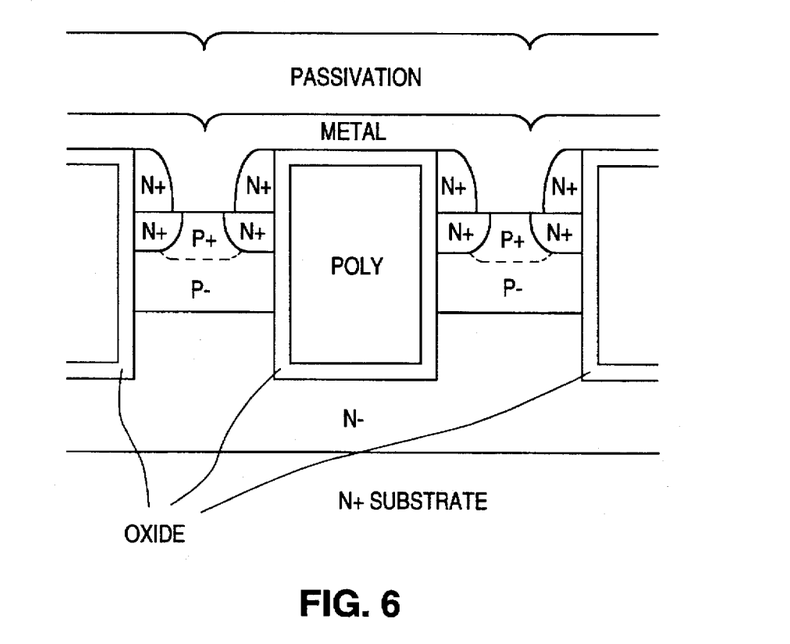
FIG. 6 is a cross-sectional illustration of two trench DMOS transistor pair cells according to an alternative embodiment of the present invention.

According to an alternative embodiment of the present invention, a trench DMOS transistor is fabricated using six masks. As illustrated in FIG. 6, in the trench transistors, the channel is formed vertically. The formation of the trench DMOS transistors requires the additional steps involved in forming of a trench. In order to fabricate a trench DMOS device, the above-described process is only slightly modified. After the wet etch of the initial field oxide to form the active region (resulting in the structure shown in FIG. 3C), the following steps are inserted. A trench photoresist mask is deposited to delineate and expose the trench regions. An anisotropic dry etch is performed to "dig" the trenches to a depth deep enough to allow the formation of the N+ source by down diffusion and the P– body along the side perimeter. After the trench photoresist is stripped, gate oxide is grown on the sidewalls of the trenches (similar to the procedure in FIG. 3D). Then the process reverts to the flow described above with respect to discrete polysilicon gate DMOS. When the polysilicon is deposited to a sufficient thickness (approximately half the trench width), the trench becomes filled with polysilicon gate material. The remaining steps according to the first embodiment are performed as described above, and the resulting structure is shown in FIG. 6.

According to yet another embodiment of the present invention, the structures and methods of the present invention are also fully compatible with Integrated DMOS (not illustrated) using buried layers for drain contacts. An integrated DMOS device is similar to the polysilicon gate DMOS described as the preferred embodiment. However, it is formed over a buried N+ drain layer rather than a common N+ drain substrate. An N+ diffusion region connects the buried N+ drain layer to a drain contact on the surface of the substrate. Various ad hoc circuits can be built using the integrated DMOS transistors. P type trenches provide electrical isolation as necessary.

While the present invention has been disclosed with particular reference to its preferred and alternative embodiments, those embodiments are presented by way of example, not by way of limitation. Those of ordinary skill in the art will be enabled by this disclosure to add to or modify the embodiments of the present invention as disclosed herein in various ways as needed and still be within the scope and spirit of the present invention as recited in the appended claims. For example, P-channel DMOS devices can be fabricated instead of N-channel devices described above. Accordingly, various changes and modifications which are obvious to a person skilled in the art to which the invention pertains are deemed to lie within the spirit and scope of the invention as claimed.

What is claimed is:

1. A method of fabricating a semiconductor device, the method comprising the steps of:
   (a) growing a gate oxide layer of silicon dioxide on an underlying epitaxial layer of a first conductivity type;
   (b) depositing a gate conductive layer onto the gate oxide layer;
   (c) doping the gate conductive layer with impurities of a first conductivity type;
   (d) defining a gate mask over the gate conductive layer;
   (e) etching the gate conductive layer and underlying gate oxide layer through the gate mask to form transistor gates;
   (f) stripping the gate mask;
   (g) growing an insulating oxide layer of silicon dioxide;
   (h) implanting impurities of a second conductivity type to form body implant regions in the epitaxial layer;

(i) performing a thermal drive-in to diffuse the impurities of the second conductivity type vertically and laterally to form diffused body regions;

(j) etching the insulating oxide layer so as to remove the insulating oxide layer from regions directly overlying the epitaxial layer while leaving insulating oxide sidewalls that cross-sectionally surround the transistor gates;

(k) depositing polysilicon to form a spacer polysilicon layer;

(l) doping the spacer polysilicon layer with impurities of the first conductivity type;

(m) etching the spacer polysilicon layer to form polysilicon spacers adjacent to the insulating oxide sidewalls;

(n) implanting impurities of the second conductivity type to form body contact implant regions in the epitaxial layer; and (o) annealing to diffuse the impurities of the first conductivity type from the spacers into the epitaxial layer to form source regions.

2. A method of fabricating a semiconductor device as in claim 1, further comprising, prior to step (a), the steps of:

(p) growing a field oxide layer;

(q) defining a field oxide mask;

(r) etching the field oxide layer from exposed regions in the field oxide mask back to the epitaxial layer to form an active region; and (s) stripping the field oxide mask.

3. A method of fabricating a semiconductor device as in claim 2, further comprising, prior to step (p), the step of:

(t) growing the epitaxial layer of the first conductivity type on a highly-doped substrate of the first conductivity type.

4. A method of fabricating a semiconductor device as in claim 2, further comprising, after step (o), the steps of:

(u) defining a gate contact mask on the field oxide layer above the gate conductive layer;

(v) etching the insulating oxide layer through the gate contact mask to expose the gate conductive layer;

(w) stripping the gate contact mask;

(x) depositing a metal layer;

(y) defining a metal mask to protect a gate pad bonding region, a source pad bonding region, and a source contact region overlying the active region, wherein the source pad region and source contact region are connected;

(z) etching the metal layer in regions exposed by the metal mask;

(aa) stripping the metal mask;

(bb) depositing a passivation layer;

(cc) defining a pad mask to expose a portion of the gate pad bonding region and a portion of the source pad bonding region;

(dd) etching the passivation layer in regions exposed by the pad mask; and (ee) stripping the pad mask.

5. A method of fabricating a semiconductor device as in claim 2, further comprising, prior to step (p), the step of:

(ff) growing the epitaxial layer of the first conductivity type on a highly-doped substrate of the second conductivity type.

6. A method of fabricating a semiconductor device as in claim 1, further comprising, prior to step (a), the step of:

(gg) defining a trench mask on the epitaxial layer;

(hh) etching exposed regions of the epitaxial layer to define trenches; and (ii) stripping the trench mask.

7. A method of fabricating a semiconductor device as in claim 1, wherein the gate conductive layer formed in step (b) is made of polysilicon.

8. A method of fabricating a semiconductor device as in claim 1, wherein the gate conductive layer formed in step (b) is made of polycide.

9. A method of fabricating a semiconductor device as in claim 8, wherein the gate conductive layer is made of tungsten silicide and polysilicon.

10. A method of fabricating a semiconductor device as in claim 1, wherein the gate etching step (e) is performed using an anisotropic vertical etch.

11. A method of fabricating a semiconductor device as in claim 1, wherein the spacer polysilicon etching step (m) is performed using an anisotropic vertical etch.

12. A method of fabricating a semiconductor device as in claim 1, further comprising, between steps (k) and (l), the step of:

(jj) depositing a thin screen oxide layer.

13. A method of fabricating a semiconductor device as in claim 1, wherein the implanting step (n) uses an impurity concentration level of the second conductivity type which low enough so as not to reverse or significantly decrease a doping concentration in the polysilicon spacers formed in step (m).

14. A method of fabricating a semiconductor device as in claim 2, wherein the first conductivity type is N type, and the second conductivity type is P type.

15. A method of fabricating a semiconductor device as in claim 5, wherein the first conductivity type is N type, and the second conductivity type is P type.

16. A method of fabricating a semiconductor device as in claim 1, wherein the spacer polysilicon layer doping step (l) is performed by implanting impurities of the first conductivity type after deposition step (k).

17. A method of fabricating a semiconductor device as in claim 1, wherein the spacer polysilicon layer doping step (l) is performed by circulating impurities of the first conductivity type simultaneously with deposition step (k).

18. A method of fabricating a semiconductor device as in claim 1, further comprising, after step (j) and prior to step (k), the step of:

(kk) depositing a compound containing impurities of the first conductivity type, such that step (l) is performed by diffusion of the impurities of the first conductivity type upward into the spacer polysilicon layer.

19. A device structure, comprising:

a first conductive gate of a first conductivity type that is cross-sectionally surrounded by first insulating silicon dioxide and is formed above an epitaxial layer of the first conductivity type;

a first polysilicon spacer of the first conductivity type adjacent to a sidewall of the first insulating silicon dioxide surrounding the first conductive gate and overlying the epitaxial layer;

a first source region of the first conductivity type vertically adjacent to and underlying the first polysilicon spacer, formed within the epitaxial layer, wherein the first source region has a first channel boundary surface portion underlying the first conductive gate and adjacent to the first insulating silicon dioxide, and has a first source contact surface portion extending beyond a furthest horizontal first spacer surface extension so as to allow a metal source contact to overly the first source contact surface portion; and a first body region of a second conductivity type formed within the epitaxial layer and containing the first source region, wherein the first body region has a first channel region surface which underlies the first conductive gate and is adjacent to the first insulating silicon dioxide, and has a first highly-doped body contact surface portion extending beyond the first source contact surface portion so as to allow the metal source contact to overly the first body contact surface portion.

20. A device structure as in claim 19, further comprising:

a second polysilicon spacer of the first conductivity type adjacent to a sidewall of the first insulating silicon dioxide surrounding the first conductive gate and overlying the epitaxial layer;

a second source region of the first conductivity type vertically adjacent to and underlying the second polysilicon spacer, formed within the epitaxial layer, wherein the second source region has a second channel boundary surface portion underlying the first conductive gate and adjacent to the first insulating silicon dioxide, and has a second source contact surface portion extending beyond a furthest horizontal second spacer surface extension so as to allow a metal source contact to overly the second source contact surface portion; and a second body region of a second conductivity type formed within the epitaxial layer and containing the second source region, wherein the second body region has a second channel region surface which underlies the first conductive gate and is adjacent to the first insulating silicon dioxide, and has a second highly-doped body contact surface portion extending beyond the second source contact surface portion so as to allow the metal source contact to overly the second body contact surface portion;

wherein the first and second channel region surfaces are physically separated by an active drain region.

21. A device structure as in claim 20, further comprising:

a highly-doped substrate of the first conductivity type underlying the epitaxial layer.

22. A device structure as in claim 20, further comprising:

a highly-doped substrate of the second conductivity type underlying the epitaxial layer.

23. A device structure as in claim 21, further comprising:

a source metal layer overlying the first conductive gate and adjacent to the first insulating silicon dioxide, the first and second polysilicon spacers, the first and second source contact surface portions, and the first and second highly-doped body contact surface portions.

24. A device structure as in claim 23, further comprising:

a passivation layer overlying the metal layer.

25. A device structure as in claim 19, further comprising:

a second conductive gate of the first conductivity type that is cross-sectionally surrounded by second insulating silicon dioxide and is formed above the epitaxial layer of the first conductivity type;

a second polysilicon spacer of the first conductivity type adjacent to a sidewall of the second insulating silicon dioxide surrounding the second conductive gate and overlying the epitaxial layer;

a second source region of the first conductivity type vertically adjacent to and underlying the second polysilicon spacer, formed within the first body region, wherein the second source region has a second channel boundary surface portion underlying the second conductive gate and adjacent to the second insulating silicon dioxide, and has a second source contact surface portion extending beyond a furthest horizontal second spacer surface extension so as to allow the metal source contact to overly the second source contact surface portion;

wherein the first and second source contact surface portions are separated by the first highly-doped body contact surface portion of the first body region.

26. A device structure as in claim 25, further comprising:

a highly-doped substrate of the first conductivity type underlying the epitaxial layer.

27. A device structure as in claim 26, further comprising:

a source metal layer overlying the first and second conductive gates and adjacent to the first and second insulating silicon dioxides, the first and second polysilicon spacers, the first and second source contact surface portions, and the first highly-doped body contact surface portion.

28. A device structure as in claim 27, further comprising:

a passivation layer overlying the metal layer.

29. A device structure as in claim 20, wherein the first conductive gate comprises polysilicon.

30. A device structure as in claim 25, wherein the first and second conductive gates comprise polysilicon.

31. A device structure as in claim 19, wherein the first conductivity type is N type, and the second conductivity type is P type.

32. A trench DMOS transistor structure, comprising:

a first trench formed in a layer of epitaxial silicon having a first conductivity type;

a first conductive gate in the first trench that is cross-sectionally surrounded by first insulating silicon dioxide and that vertically protrudes above the epitaxial silicon;

a first polysilicon spacer of the first conductivity type adjacent to a sidewall of the first insulating silicon dioxide surrounding the first conductive gate and overlying the epitaxial layer;

a first source region of the first conductivity type vertically adjacent to and underlying the first polysilicon spacer, formed within the epitaxial layer, wherein the first source region has a first vertical channel boundary surface portion beside the first conductive gate and adjacent to the first insulating silicon dioxide, and has a first source contact surface portion extending beyond a furthest horizontal first spacer surface extension so as to allow a metal source contact to overly the first source contact surface portion; and a first body region of a second conductivity type formed within the epitaxial layer and containing the first source region, wherein the first body region has a first channel region surface beside the first conductive gate and adjacent to the first insulating silicon dioxide, and has a first highly-doped body contact surface portion extending beyond the first source contact surface portion so as to allow the metal source contact to overly the first body contact surface portion.

33. A trench DMOS transistor structure as in claim 32, further comprising:

a second polysilicon spacer of the first conductivity type adjacent to a sidewall of the second insulating silicon dioxide surrounding the first conductive gate and overlying the epitaxial layer;

a second source region of the first conductivity type vertically adjacent to and underlying the second polysilicon spacer, formed within the epitaxial layer, wherein the second source region has a second vertical channel boundary surface portion beside the first conductive gate and adjacent to the second insulating silicon dioxide, and has a second source contact surface portion extending beyond a furthest horizontal second spacer surface extension so as to allow a metal source contact to overly the second source contact surface portion; and a second body region of a second conductivity type formed within the epitaxial layer and containing the second source region, wherein the second body region has a second channel region surface beside the first conductive gate and adjacent to the second insulating silicon dioxide, and has a second highly-doped body contact surface portion extending beyond the second source contact surface portion so as to allow the metal source contact to overly the second body contact surface portion.

34. A trench DMOS transistor structure as in claim 33, further comprising:

a highly-doped substrate of the first conductivity type underlying the epitaxial layer.

35. A trench DMOS transistor structure as in claim 34, further comprising:

a source metal layer overlying the first conductive gate and adjacent to the first insulating silicon dioxide, the first and second polysilicon spacers, the first and second source contact surface portions, and the first and second highly-doped body contact surface portions.

36. A trench DMOS transistor structure as in claim 35, further comprising:

a passivation layer overlying the metal layer.

37. A trench DMOS transistor structure as in claim 32, further comprising:

a second trench formed in the layer of epitaxial silicon having the first conductivity type;

a second conductive gate in the second trench that is cross-sectionally surrounded by second insulating silicon dioxide and that vertically protrudes above the epitaxial silicon;

a second polysilicon spacer of the first conductivity type adjacent to a sidewall of the second insulating silicon dioxide surrounding the second conductive gate and overlying the epitaxial layer;

a second source region of the first conductivity type vertically adjacent to and underlying the second polysilicon spacer, formed within the first body region, wherein the second source region has a second vertical channel boundary surface portion beside the second conductive gate and adjacent to the second insulating silicon dioxide, and has a second source contact surface portion extending beyond a furthest horizontal second spacer surface extension so as to allow the metal source contact to overly the second source contact surface portion;

wherein the first and second source contact surface portions are separated by the first highly-doped body contact surface portion of the first body region.

38. A trench DMOS transistor structure as in claim 37, further comprising:

a highly-doped substrate of the first conductivity type underlying the epitaxial layer.

39. A trench DMOS transistor structure as in claim 38, further comprising:

a source metal layer overlying the first and second conductive gates and adjacent to the first and second insulating silicon dioxides, the first and second polysilicon spacers, the first and second source contact surface portions, and the first highly-doped body contact surface portion.

40. A trench DMOS transistor structure as in claim 39, further comprising:

a passivation layer overlying the metal layer.

41. A trench DMOS transistor structure as in claim 33, wherein the first conductive gate comprises polysilicon.

42. A trench DMOS transistor structure as in claim 37, wherein the first and second conductive gates comprise polysilicon.

43. A trench DMOS transistor structure as in claim 32, wherein the first conductivity type is N type, and the second conductivity type is P type.

* * * * *